(12) United States Patent
Ino

(10) Patent No.: US 6,414,380 B1
(45) Date of Patent: Jul. 2, 2002

(54) SEMICONDUCTOR DEVICE AND METHOD OF MAKING SAME

(75) Inventor: Yoshihiko Ino, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/956,801

(22) Filed: Sep. 21, 2001

(30) Foreign Application Priority Data

Nov. 15, 2000 (JP) ........................................ 2000-347855

(51) Int. Cl.[7] ............................ H01L 23/06; H01L 23/28
(52) U.S. Cl. ........................ 257/668; 257/784; 257/787
(58) Field of Search .................................. 257/787, 668, 257/784, 693, 737; 438/123, 127, 112, 612

(56) References Cited

U.S. PATENT DOCUMENTS

| 5,942,784 A | * | 8/1999 | Okumura et al. | ............ 257/666 |
|---|---|---|---|---|
| 6,002,169 A | * | 12/1999 | Chi et al. | .................... 257/697 |
| 6,163,069 A | * | 12/2000 | Oohira et al. | ................ 257/684 |
| 6,242,815 B1 | * | 6/2001 | Hsu et al. | .................... 257/786 |
| 6,308,938 B1 | * | 10/2001 | Futakuchi | .................... 257/780 |
| 6,191,494 B1 | * | 2/2002 | Ooyama et al. | ............. 257/796 |
| 6,348,416 B1 | * | 2/2002 | Toya et al. | ................. 438/694 |
| 6,198,165 B1 | * | 3/2002 | Yamaji et al. | .............. 257/734 |
| 6,365,432 B1 | * | 4/2002 | Fukutomi et al. | ........... 438/106 |
| 6,365,980 B1 | * | 4/2002 | Carter et al. | ................ 257/787 |

* cited by examiner

Primary Examiner—Jasmine J B Clark
(74) Attorney, Agent, or Firm—Kanesaka & Takeuchi

(57) ABSTRACT

A semiconductor device comprises an insulative board (1), a thermally plastic resin (2) coated on the insulative board (1), a semiconductor element (3) secured by the thermally plastic resin (2) and having an electrode (3a), at least one metal wire (4) extending through the thermally plastic resin (2) and the insulative board (1) and having an end (4a) connected to the electrode (3a) and, at the other end, a metal ball (4b) embedded in the insulative board (1), an enveloping resin (5) for covering the metal wire (4), and at least one metal bump (6) connected to the metal ball (4b).

4 Claims, 5 Drawing Sheets

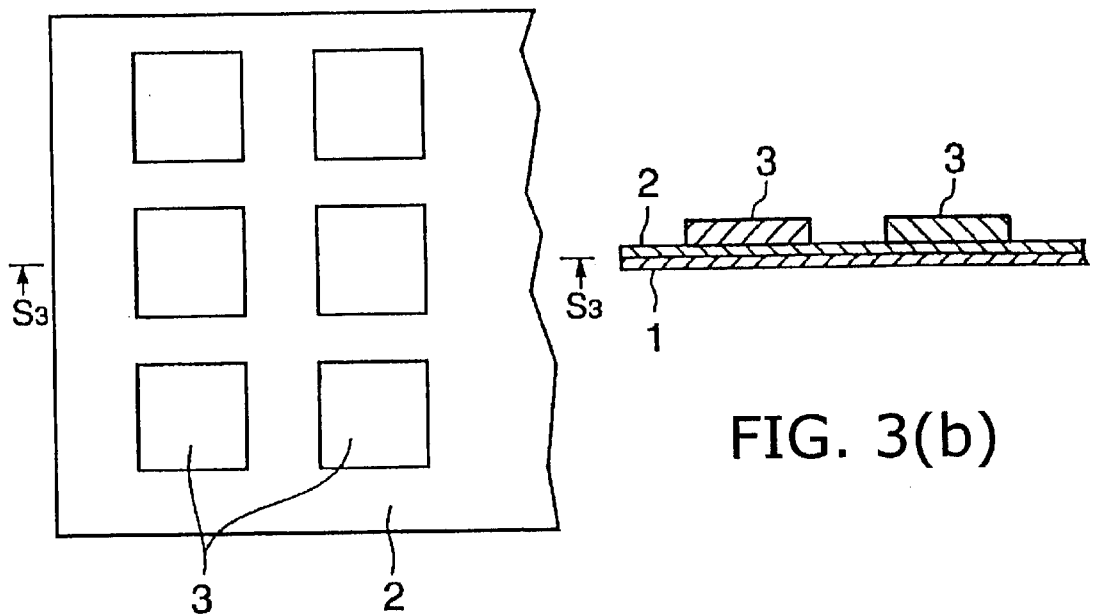
FIG. 3(b)
FIG. 3(a)
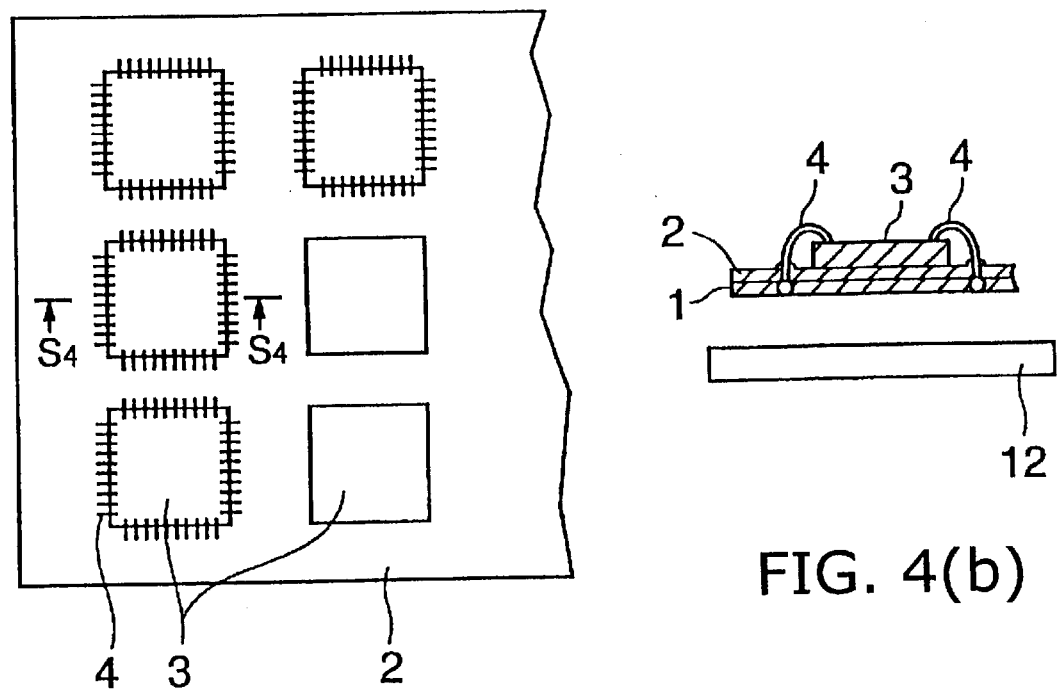
FIG. 4(b)
FIG. 4(a)

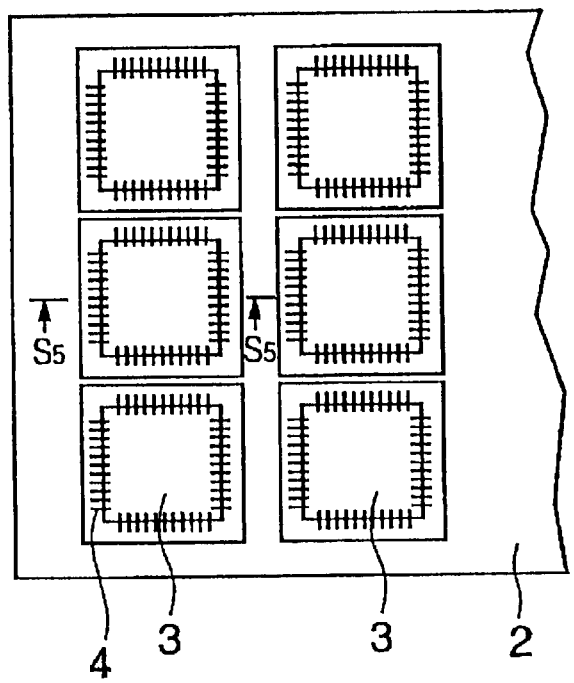
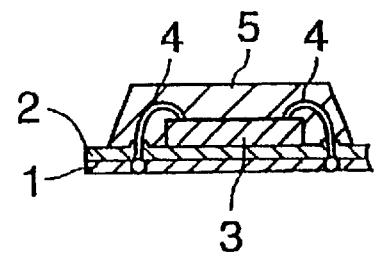
FIG. 5(b)
FIG. 5(a)
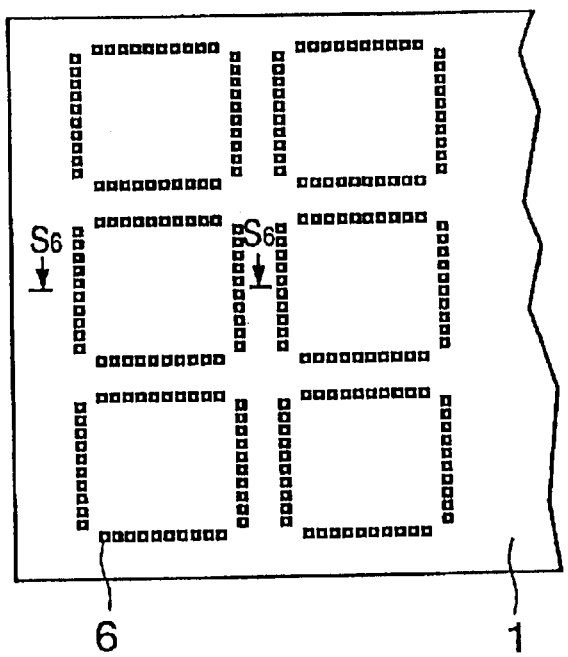
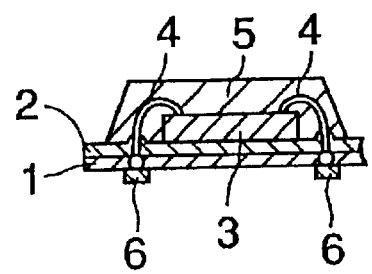
FIG. 6(b)
FIG. 6(a)

SEMICONDUCTOR DEVICE AND METHOD OF MAKING SAME

BACKGROUND OF THE INVENTION

1. Field of the Invention

The present invention relates to semiconductor devices and, particularly, to a semiconductor device package and a method of making the same.

This application is a counterpart of Japanese application Serial Number 2000-347855, filed on Nov. 15, 2000, the subject matter of which is incorporated herein by reference.

2. Description of the Related Art

FIG. 10 shows a conventional ball grid array (BGA) type semiconductor device. The BGA type semiconductor device comprises an insulative board 51 and a plurality of metal bumps or solder balls 52 arranged on the lower face of the insulative board 51 as outer electrodes so that it makes miniaturization possible and stronger and easier to handle than the pin type package. Also, it comprises a plurality of conductive members or metal foils 53 and conductive members 54 and 55. A solder resist 56 is provided on the lower face of the insulative board 51. A semiconductor element 58 is bonded to the upper face of the insulative board 51 with a bonding agent 57. The electrodes 59 of the semiconductor element 59 are connected to the conductive members 53 by metal wires 60, which are covered by an insulative resin 61.

However, the BGA type semiconductor device has the solder resist 56 to coat the lower face of the insulative board 51 so that if the solder resist 56 has low adhesive powers, it could separate to lower the reliability of the semiconductor device. Since the insulative board 51 already has the conductive members 53, 54, and 55, the solder resist 56, and the metal bumps 52, the manufacturing cost is high.

SUMMARY OF THE INVENTION

Accordingly, it is an object of the invention to provide a simple, inexpensive, and reliable semiconductor device having advantages of the BGA type semiconductor device, such as miniaturization, strength, and easiness to handle.

According to one aspect of the invention there is provided a semiconductor device which comprises an insulative board having first and second opposed faces; a thermally plastic resin provided on the first face of the insulative board; a semiconductor element secured to the first face of the insulative board by the thermally plastic resin and having at least one electrode; at least one metal wire having an end bonded to the electrode of the semiconductor element and the other end put through the thermally plastic resin and the insulative board to form a metal ball that is embedded in the insulative board on a side of the second face of the insulative board; an enveloping resin for enveloping the metal wire on a side of the first face of the insulative board, and at least one metal bump provided on the second face of the insulative board and connected to the metal ball.

According to an embodiment of the invention, the insulative board has a tape-shaped form.

According to another embodiment of the invention the insulative board is curable with ultraviolet rays.

According to still another embodiment of the invention, the insulative board is made of nonwoven cotton fabric.

According to another aspect of the invention there is provided a method of making a semiconductor device which comprises the steps of coating a first face of an insulative board with a thermally plastic resin; bonding a semiconductor element onto the thermally plastic resin; piercing the thermally plastic resin and the insulative board with at least one capillary that holds a metal wire, forming a metal ball at a front end of the metal wire on a side of a second face of the insulative board that is opposite to the first face of the insulative board and pulling out the capillary from the insulative board and the thermally plastic resin such that the metal ball is embedded in the insulative board; pressing the capillary onto an electrode of the semiconductor element to bond the metal wire to the electrode and cutting off an extra wire; and attaching at least one metal bump to the second face of the insulative board so as to be connected to the metal ball.

According to still another aspect of the invention there is provided a method of making a semiconductor device, comprising the steps of applying a coat of thermally plastic resin to a first face of an insulative board that is curable with ultraviolet rays; bonding a semiconductor element onto the thermally plastic resin; piercing the thermally plastic resin and the insulative board with at least one capillary that holds a metal wire, forming a metal ball at a front end of the metal wire on a side of a second face of the insulative board that is opposite to the first face of the insulative board and pulling out the capillary from the insulative board and the thermally plastic resin such that the metal ball is embedded in the insulative board; pressing the capillary onto an electrode of the semiconductor element to bond the metal wire to the electrode and cutting off an extra wire; irradiating the insulative board with the ultraviolet rays; and attaching at least one metal bump to the second face of the insulative board so as to be connected to the metal ball.

According to yet another aspect of the invention there is provided a method of making a semiconductor device, comprising the steps of coating a first face of an insulative board of nonwoven cotton fabric with a thermally plastic resin; bonding a semiconductor element onto the thermally plastic resin; piercing the thermally plastic resin and the insulative board with at least one capillary that holds a metal wire, forming a metal ball at a front end of the metal wire on a side of a second face of the insulative board that is opposite to the first face of the insulative board and pulling out the capillary from the insulative board and the thermally plastic resin such that the metal ball is embedded in the insulative board; pressing the capillary onto an electrode of the semiconductor element to bond the metal wire to the electrode and cutting off an extra wire; and attaching at least one metal bump to the second face of the insulative board so as to be connected to the metal ball.

According to yet another embodiment of the invention, the capillary piercing step is performed while the thermally plastic resin is heated on a heat stage.

According to another embodiment of the invention, the metal ball of the metal wire is formed by a spark produced between the metal wire and an electric torch.

BRIEF DESCRIPTION OF THE DRAWINGS

FIG. 3(a) is a plan view of the tape of insulative boards on which semiconductor elements are bonded;

FIG. 3(b) is a sectional view taken along line S3—S3 of FIG. 3(a);

FIG. 4(a) is a plan view of the tape of insulative boards to which metal wires are attached;

FIG. 4(b) is a sectional view taken along line S4—S4 of FIG. 4(a);

FIG. 5(a) is a plan view of the tape of insulative boards on which enveloping resins are applied;

FIG. 5(b) is a sectional view taken along line S5—S5 of FIG. 5(a);

FIG. 6(a) is a plan view of the lower face of the tape of insulative boards to which metal bumps are attached;

FIG. 6(b) is a sectional view taken along line S6—S6 of FIG. 6(a);

DESCRIPTION OF THE PREFERRED EMBODIMENTS

First Embodiment

Figure 1:
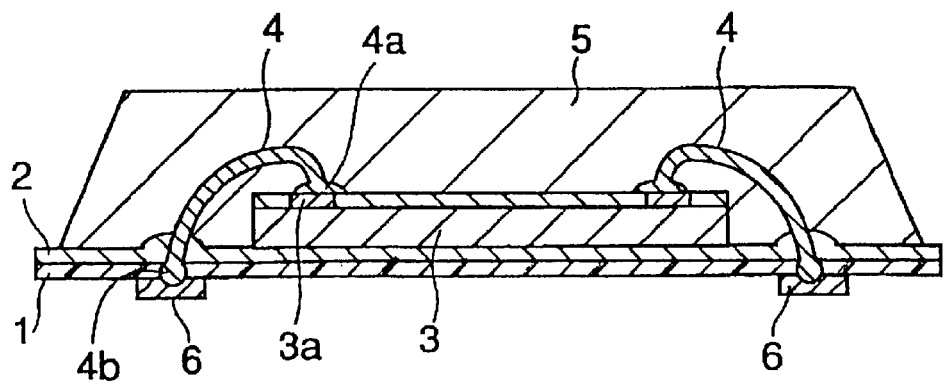
FIG. 1 is a sectional view of a semiconductor device according to an embodiment of the invention.

In FIG. 1, a semiconductor device comprises an insulative board or sheet 1, a thermally plastic resin 2 coated on the insulative sheet 1, a semiconductor element 3 secured to the insulative sheet 1 by the thermally plastic resin 2, and a plurality of metal wires 4 that are made of gold or the like. An end 4a of each metal wire 4 is connected to the electrode 3a of the semiconductor element 3 while the other end forms a metal ball 4b that is embedded in the insulative board 1 on the side of the lower face or the face opposite to the face where the semiconductor element 3 is mounted. The semiconductor device also comprises an enveloping resin 5 that is made of an insulative material to envelope the metal wires 4 on the side of the semiconductor element 3, and a plurality of metal bumps or outer electrodes 6 that are connected to the metal balls 4b. The metal bumps 6 are made of solder balls for example.

The semiconductor device is made as follows.

Figure 2A:
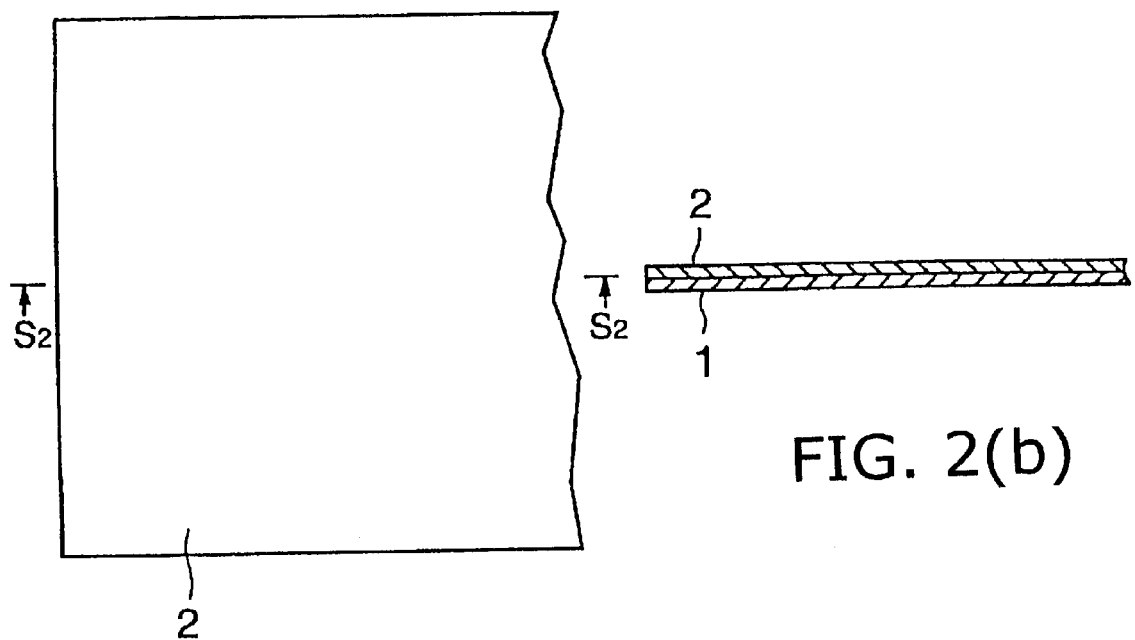
FIG. 2(a) is a plan view of a tape of insulative boards.
Figure 2B:
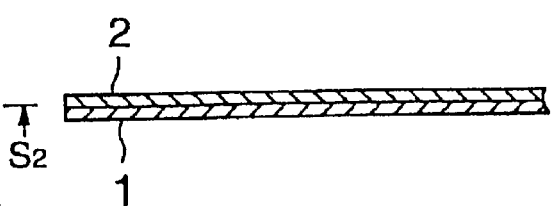
FIG. 2(b) is a sectional view taken along line S2—S2 of FIG. 2(a)

In FIGS. 2(a) and 2(b), a tape of the insulative board 1 is unreeled and the thermally plastic resin 2 is coated on the tape.

In FIGS. 3(a) and 3(b), a plurality of semiconductor elements 3 are bonded under heat and pressure onto the thermally plastic resin 2.

In FIGS. 4(a) and 4(b), the metal wires 4 are attached while the thermally plastic resin 2 is softened on a heat stage 12. This step comprises the following substeps.

Figure 7A:
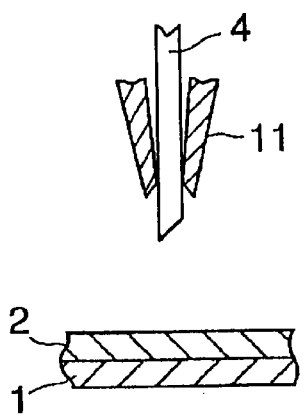
FIGS. 7(a)–(f) are diagrams showing the steps of making the metal wires of FIG. 4(a)
Figure 7B:
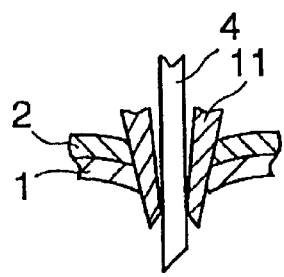
Figure 7C:
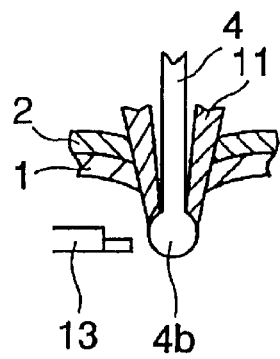
Figure 7D:
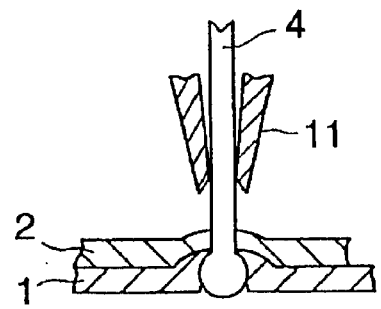
Figure 7E:
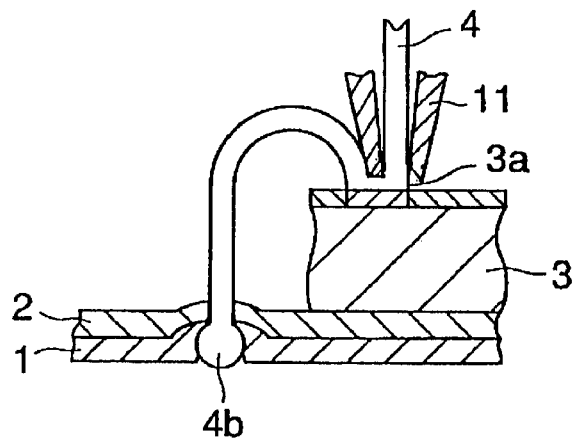
Figure 7F:
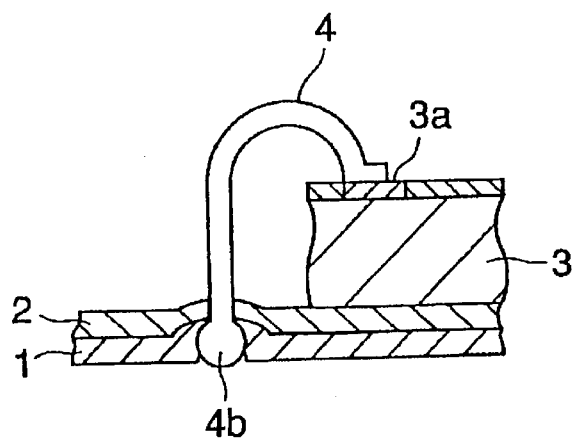

A capillary 11 that holds the metal wire 4 as shown in FIG. 7(a) is put through the thermally plastic resin 2 and the insulative board 1 as shown in FIG. 7(b). Then, a metal ball 4b is formed at the front end of the metal wire 4 by the spark between an electric torch 13 and the metal wire 4 as shown in FIG. 7(c). Then, the capillary 11 is pulled out of the insulative board 1 and the thermally plastic resin 2 such that the metal ball 4b is embedded in the insulative board 1 as shown in FIG. 7(d). Then, the capillary 11 is press-bonded against the electrode 3a of the semiconductor element 3 to bond the metal wire 4 to the electrode 3a and cut as shown in FIGS. 7(e) and 7(f), respectively.

Then, as shown in FIGS. 5(a) and 5(b), the metal wires 4 are enveloped by the enveloping resin 5 of an insulative material that is provided on the side of the semiconductor element 3. As shown in FIGS. 6(a) and 6(b), a plurality of metal bumps 6 connected to the metal balls 4b are attached to the lower face of the insulative board 1. Then, a plurality of the semiconductor elements on the insulative board 11 are divided by individual cut to provide a semiconductor device such as shown in FIG. 1.

As has been described above, according to the first embodiment of the invention, the metal bumps 6 are provided on the lower face of the insulative board 1 as outer electrodes so that further miniaturization is possible and, since the metal bumps 6 do not have a pin-shaped form, the semiconductor device is strong and easy to handle. Also, it is simpler than the BGA type semiconductor device, thus making it possible to reduce the manufacturing cost. In addition, no solder resist coating is used so that there is no solder resist separation, eliminating the reliability problem resulting therefrom. Furthermore, the enveloping resin 5 has high reflow resistance.

The method of making the semiconductor device according to the first embodiment of the invention is applicable to the semiconductor elements 3 of any chip-size that can be mounted within the tape of the insulative board 1. In addition, a variety of semiconductor element chips can be mounted on the same insulative board 1. Furthermore, the steps of drawing a tape of the insulative board 1 from a reel, installation of the semiconductor elements 3, formation of the metal wires 4, enveloping of the resin 5, and formation of the metal bumps 6 by solder printing can be streamlined to minimize the number of process steps. Moreover, the electrodes are provided on the lower face of the insulative board 1 so that a great number of metal bumps 6 can be made readily to provide a multiple pin semiconductor device.

Second Embodiment

Figure 8:
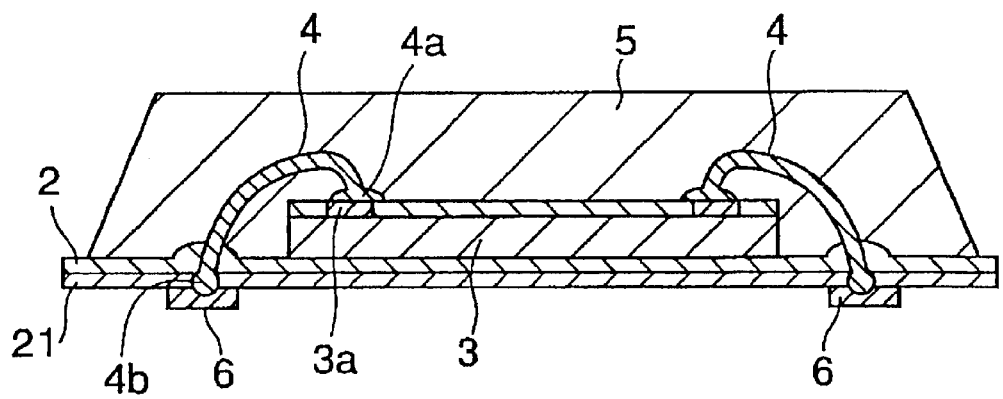
FIG. 8 is a sectional view of a semiconductor device according to the second embodiment of the invention.

In FIG. 8, a semiconductor device according to the second embodiment of the invention is the same as that of the first embodiment except that an insulative board 21 is cured by ultraviolet radiation. The method of making the semiconductor device according to the second embodiment comprises the step of irradiating ultraviolet rays to the insulative board 21 following the step of piercing or putting the capillary through the insulative board 21. This irradiating step prevents the insulative board 21 from being torn by the capillary piercing. The other features and functions of the second embodiment are the same as those of the first embodiment.

Third Embodiment

Figure 9:
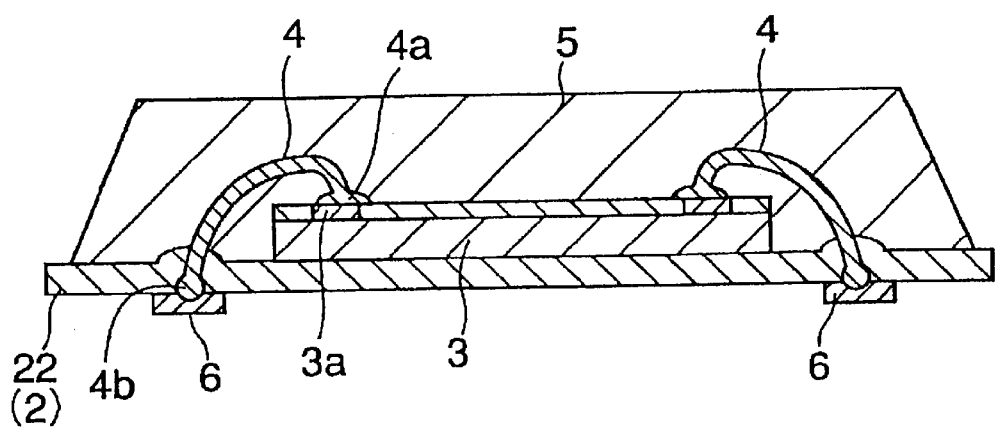
FIG. 9 is a sectional view of a semiconductor device according to the third embodiment of the invention.
Figure 10:
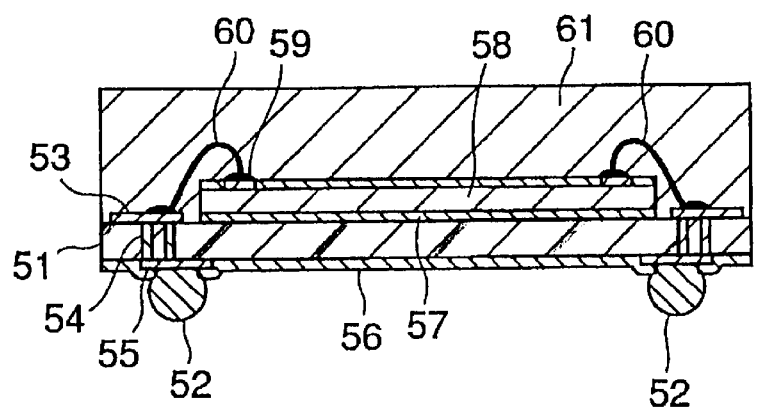
FIG. 10 is a sectional view of a conventional semiconductor device.

In FIG. 9, a semiconductor device according to the third embodiment of the invention is the same as that of the first embodiment except that the insulative board is replaced by an insulative board 22 that is made of nonwoven cotton fabric that is impregnated with the thermally plastic resin 2 to form such an integral layer as shown. A preferred example of the nonwoven cotton fabric is Benleaze (trademark) of Asahi Kasei Co., Ltd. It has a carbonization temperature from 260 to 300 degrees C., which is substantially higher than 180 degrees C. or the molding temperature of the thermally plastic resin. By heating the insulative board 22 it is possible to prevent the insulative board 22 from being torn in the capillary piercing step. The use of the nonwoven cotton fabric reduces the manufacturing cost. The other features and functions of the third embodiment are the same as those of the first embodiment.

As has been described above, according to the invention, the metal bumps are provided on the lower face of an insulative board so that further miniaturization is possible. Since the metal bumps do not have a pin-shaped form, they are strong and easy to handle. The semiconductor device is simpler than the BGA type semiconductor device so that it is possible to cut the manufacturing cost. Since no solder resist coating is used, there is no solder resist separation that reduces the reliability of the semiconductor device. Finally, the enveloping resin applied to the semiconductor device has an excellent reflow resistance.

According to another aspect of the invention, the manufacturing method is useful for semiconductor elements of any size that is mountable within the insulative board. In addition, the same insulative board is useful for any type of semiconductor chip. It is possible to streamline the steps of drawing a tape of insulative board from a reel, bonding the semiconductor element, forming the metal wires, enveloping with the resin, and forming metal bumps by solder printing so that it is possible to reduce the number of process steps. Furthermore, a great number of bumps can be formed, making it easy to provide a multiple-pin semiconductor device.

Following the step of piercing the insulative board with the capillary, the step of irradiating the insulative board with ultraviolet rays is provided to prevent the insulative board from being torn in the capillary piercing step.

The employment of the nonwoven cotton fabric for the insulative board reduces the manufacturing cost.

What is claimed is:

1. A semiconductor device, comprising:

an insulative board having first and second opposed faces;

a thermally plastic resin provided on said first face of said insulative board;

a semiconductor element secured to said first face of said insulative board by said thermally plastic resin and having at least one electrode;

at least one metal wire having an end bonded to said electrode of said semiconductor element and the other end put through said thermally plastic resin and said insulative board to form a metal ball that is embedded in said insulative board on a side of said second face of said insulative board;

an enveloping resin for enveloping said metal wire on a side of said first face of said insulative board; and at least one metal bump provided on said second face of said insulative board and connected to said metal ball.

2. The semiconductor device according to claim 1, wherein said insulative board has a tape-shaped form.

3. The semiconductor device according to claim 1 or 2, wherein said insulative board is curable with ultraviolet rays.

4. The semiconductor device according to claim 1 or 2, wherein said insulative board is made of nonwoven cotton fabric.

* * * * *